United States Patent
Shimoishizaka et al.

(10) Patent No.: US 7,595,222 B2
(45) Date of Patent: Sep. 29, 2009

(54) SEMICONDUCTOR DEVICE AND MANUFACTURING METHOD THEREOF

(75) Inventors: Nozomi Shimoishizaka, Kyoto (JP); Toshiyuki Fukuda, Kyoto (JP)

(73) Assignee: Panasonic Corporation, Osaka (JP)

( * ) Notice: Subject to any disclaimer, the term of this patent is extended or adjusted under 35 U.S.C. 154(b) by 529 days.

(21) Appl. No.: 11/057,195

(22) Filed: Feb. 15, 2005

(65) Prior Publication Data

US 2005/0146005 A1 Jul. 7, 2005

Related U.S. Application Data

(62) Division of application No. 10/185,000, filed on Jul. 1, 2002, now abandoned.

(30) Foreign Application Priority Data

Jul. 4, 2001 (JP) ............................ 2001-203030

(51) Int. Cl.
*H01L 21/00* (2006.01)

(52) U.S. Cl. ............... 438/107; 438/598; 257/E25.015; 257/E25.018

(58) Field of Classification Search ................ 438/616, 438/598, 107, 455, 109; 257/E25.015, E25.018
See application file for complete search history.

(56) References Cited

U.S. PATENT DOCUMENTS

| | | | |
|---|---|---|---|
| 3,453,711 A * | 7/1969 | Miller ........................ | 29/25.35 |
| 4,555,720 A | 11/1985 | Readhead | |
| 5,234,633 A | 8/1993 | Imataki et al. | |
| 5,268,065 A * | 12/1993 | Grupen-Shemansky ..... | 438/118 |
| 5,422,435 A | 6/1995 | Takiar et al. | |
| 5,653,019 A * | 8/1997 | Bernhardt et al. ............. | 29/840 |
| 5,877,478 A | 3/1999 | Ando | |
| 6,049,124 A | 4/2000 | Raiser et al. | |
| 6,153,929 A | 11/2000 | Moden et al. | |
| 6,215,182 B1 | 4/2001 | Ozawa et al. | |

(Continued)

FOREIGN PATENT DOCUMENTS

JP    60-130854    7/1985

(Continued)

OTHER PUBLICATIONS

The American Heritage Dictionary, Fourth Edition, 2004, pp. 39, 1022.*

*Primary Examiner*—David S Blum
*Assistant Examiner*—Vicki B Booker
(74) *Attorney, Agent, or Firm*—McDermott Will & Emery LLP

(57) ABSTRACT

The semiconductor device includes a first semiconductor chip having first electrodes on a fringe region of a main surface thereof, and a second semiconductor chip smaller in area than the first semiconductor chip and having second electrodes on a main surface thereof. The first semiconductor chip and the second semiconductor chip are connected together by bonding a surface of the second semiconductor chip that is opposite to the main surface thereof to a region of the main surface of the first semiconductor chip other than the fringe region. The first electrodes are connected to the second electrodes by wirings formed over the main surface of the first semiconductor chip, a side surface of the second semiconductor chip and the main surface of the second semiconductor chip.

6 Claims, 10 Drawing Sheets

U.S. PATENT DOCUMENTS

| | | |
|---|---|---|
| 6,352,879 B1 * | 3/2002 | Fukui et al. .................. 438/106 |
| 6,376,904 B1 | 4/2002 | Haba et al. |
| 6,501,663 B1 | 12/2002 | Pan |
| 6,568,863 B2 | 5/2003 | Murata |
| 6,747,348 B2 | 6/2004 | Jeung et al. |
| 6,756,252 B2 | 6/2004 | Nakanishi |
| 2002/0125557 A1 * | 9/2002 | Chen et al. .................. 257/686 |
| 2003/0211707 A1 * | 11/2003 | Brouillette et al. .......... 438/459 |

FOREIGN PATENT DOCUMENTS

| | | |
|---|---|---|
| JP | 61-113252 | 5/1986 |
| JP | 05-013663 | 1/1993 |
| JP | 07-183455 | 7/1995 |
| JP | 2755143 | 3/1998 |
| JP | 2001-189413 A | 7/2001 |

* cited by examiner

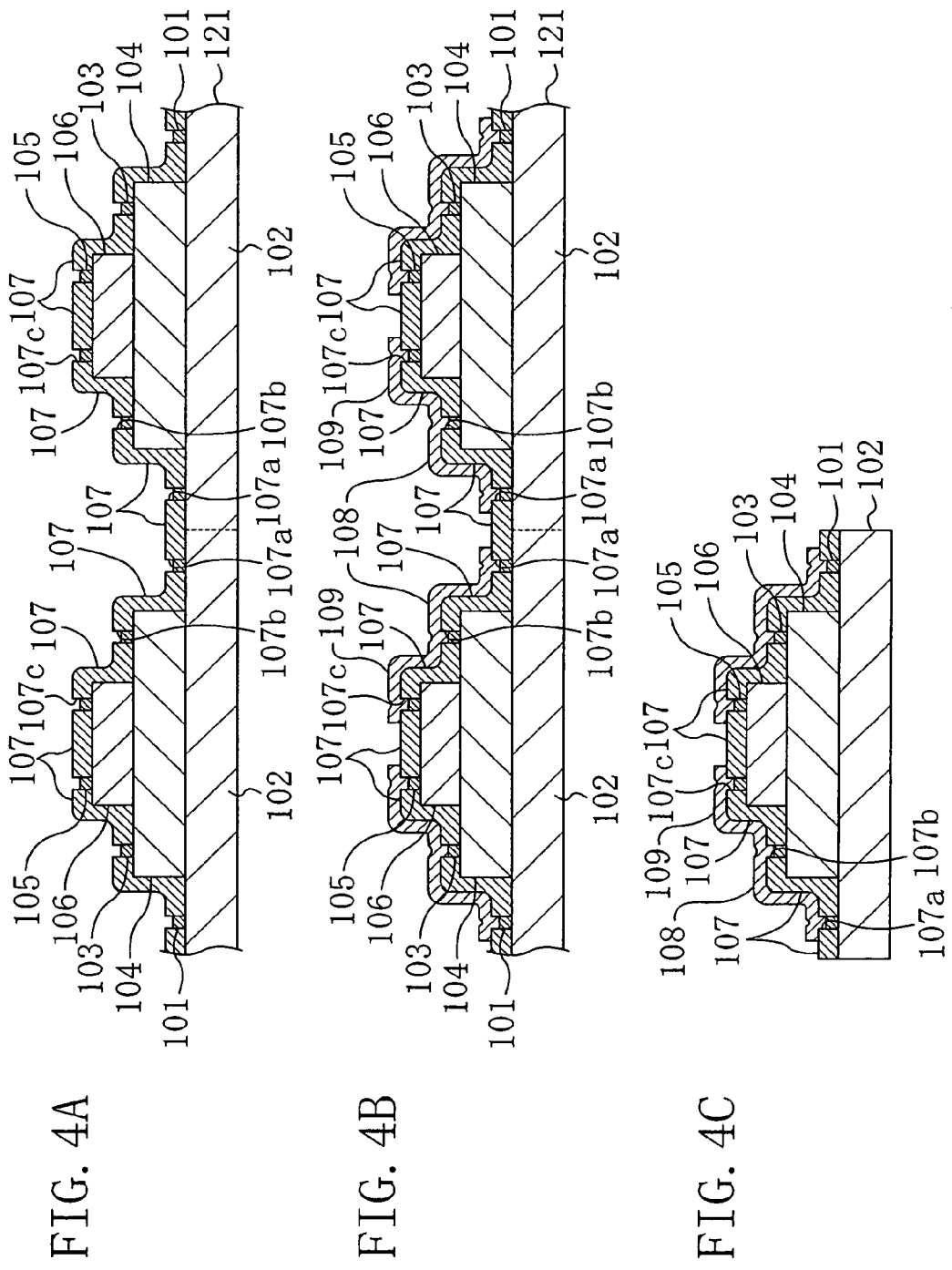

SEMICONDUCTOR DEVICE AND MANUFACTURING METHOD THEREOF

RELATED APPLICATION

This application is a divisional of application Ser. No. 10/185,000 filed Jul. 1, 2002 now abandoned.

BACKGROUND OF THE INVENTION

The present invention generally relates to a stacked-chip semiconductor device in which a plurality of semiconductor chips having different functions are stacked in a three-dimensional direction, and a manufacturing method thereof. More particularly, the present invention relates to a stacked-chip semiconductor device adapted for improved transmission speed of electric signals, and a manufacturing method thereof.

Recently, a stacked-chip semiconductor device is developed in which a plurality of semiconductor chips having different functions are stacked on a single circuit board (carrier substrate) in a single package.

Hereinafter, a semiconductor device having three semiconductor chips stacked on a circuit board will be described as a typical example of such a conventional stacked-chip semiconductor device.

FIG. 10 is a cross-sectional view showing the structure of a conventional stacked-chip semiconductor device.

Referring to FIG. 10, the conventional semiconductor device includes a circuit board 3, a first semiconductor chip 7, a second semiconductor chip 8, and a third semiconductor chip 10. The circuit board 3 has wiring electrodes 1 on its top surface and terminal electrodes 2 on its bottom surface. The first semiconductor chip 7 is bonded to the circuit board 3 with face-up state and has first electrodes 4, second electrodes 5 and third electrodes 6 at its surface. The second semiconductor chip 8 is flip-chip connected to the surface of the first semiconductor chip 7 with face-down state, and is electrically connected to the first electrodes 4 of the first semiconductor chip 7. The third semiconductor chip 10 is bonded to the rear surface of the second semiconductor chip 8 with face-up state and has fourth electrodes 9 at its surface. The second electrodes 5 of the first semiconductor chip 7 and the fourth electrodes 9 of the third semiconductor chip 10 are electrically connected to each other by first thin metal wires 11. The wiring electrodes 1 of the circuit board 3 and the third electrodes 6 of the first semiconductor chip 7 are electrically connected to each other by second thin metal wires 12. The top surface region of the circuit board 3 including the semiconductor chips and the thin metal wires is sealed with an insulating resin package 13. Note that the gap between the first and second semiconductor chips 7, 8 is sealed with a resin that is different from the resin package 13.

In the conventional semiconductor device of FIG. 10, a plurality of types of semiconductor chips that will serve as memory elements, logic elements and the like are mounted on the circuit board 3. This enables implementation of a multi-functional semiconductor device capable of implementing multifunctional elements in a single package.

In this conventional semiconductor device, however, thin metal wires are used as means for electrically connecting the chips other than the flip-chip-connected semiconductor chips. This puts limitations on improvement in transmission speed of electric signals. In other words, the use of the electric connection means like thin metal wires in a multi-functional semiconductor device having multiple chips (two or more chips) stacked in a single package results in a reduced signal propagation speed between the chips. Therefore, such a conventional semiconductor device cannot meet future expectation of improved operation speed of the semiconductor device. In other words, there is a need for an improved signal speed of a semiconductor device having two or more chips, e.g., three chips, stacked in a single package.

SUMMARY OF THE INVENTION

In view of the above problems, it is an object of the present invention to implement a high-density, high-performance semiconductor device capable of transmitting a signal with an external equipment at a high speed by improving a signal propagation speed between chips in a semiconductor device having two or more semiconductor chips stacked on each other.

In order to achieve the above object, according to a first aspect of the present invention, a semiconductor device includes a first semiconductor chip having first electrodes on a fringe region of a main surface thereof, and a second semiconductor chip smaller in area than the first semiconductor chip and having second electrodes on a main surface thereof. The first semiconductor chip and the second semiconductor chip are connected together by bonding a surface of the second semiconductor chip that is opposite to the main surface thereof to a region of the main surface of the first semiconductor chip other than the fringe region. The first electrodes are connected to the second electrodes by wirings formed over the main surface of the first semiconductor chip, a side surface of the second semiconductor chip and the main surface of the second semiconductor chip.

According to the semiconductor device of the first aspect of the present invention, the second semiconductor chip is bonded to the main surface of the first semiconductor chip with face-up state. The first electrodes on the main surface of the first semiconductor chip are connected to the second electrodes on the main surface of the second semiconductor chip by the wirings formed over the side surface of the second semiconductor chip. This reduces the signal propagation distance between the first and second electrodes, that is, the signal propagation distance between the first and second semiconductor chips, and thus improves the signal propagation speed between the chips, as compared to the case where thin metal wires are used as means for electric connection between the first and second electrodes. This results in an improved signal transmission speed between a semiconductor device having multiple chips stacked on each other and an external equipment connected thereto.

According to a second aspect of the present invention, a semiconductor device includes a first semiconductor chip having first electrodes on a fringe region of a main surface thereof, and a second semiconductor chip smaller in area than the first semiconductor chip and having second electrodes on a main surface thereof. The first semiconductor chip and the second semiconductor chip are connected together by bonding a surface of the second semiconductor chip that is opposite to the main surface thereof to a region of the main surface of the first semiconductor chip other than the fringe region. The second semiconductor chip has a side surface having an inclination of less than 90 degrees with respect to the main surface of the first semiconductor chip. The first electrodes are connected to the second electrodes by wirings formed over the main surface of the first semiconductor chip, the side surface of the second semiconductor chip and the main surface of the second semiconductor chip.

According to the semiconductor device of the second aspect of the present invention, the following effects are obtained in addition to the effects obtained in the first aspect: since the side surface of the second semiconductor chip has an inclination of less than 90 degrees with respect to the main surface of the first semiconductor chip, the length of the wirings formed over the side surface of the second semiconductor chip can be reduced as compared to the case where the side surface of the second semiconductor chip is vertical to the main surface of the first semiconductor chip. This enables further reduction in signal propagation distance between the chips and further improvement in signal propagation speed between the chips.

According to the semiconductor device of the second aspect of the present invention, the wirings for connecting the first electrodes to the second electrodes are formed on the ground having a gentler slope. This reduces concentration of stresses on the bent portion of each wiring caused by heat or mechanical stresses. As a result, disconnection of the wirings can be prevented, thereby improving reliability of the semiconductor device. Moreover, there is no abrupt difference in level between the main surface of the first semiconductor chip and the main surface of the second semiconductor chip. This facilitates a lithography process for forming the wirings for connecting the first electrodes to the second electrodes, thereby increasing a process margin. Moreover, when an insulating resin or the like is applied in order to insulate these wirings from the side surface of the second semiconductor chip, coverage of the insulating resin can be improved.

In the semiconductor device of the second aspect of the present invention, the inclination is preferably 30 degrees or more.

This prevents clacks, chippings or the like from being produced in the side portion of the second semiconductor chip.

In the semiconductor device of the first or second aspect of the present invention, the second semiconductor chip preferably has a thickness of 0.15 mm or less.

This reduces the difference in level between the main surface of the first semiconductor chip and the main surface of the second semiconductor chip. This facilitates a lithography process for forming the wirings for connecting the first electrodes to the second electrodes, thereby increasing a process margin. Moreover, this enables further reduction in size of a semiconductor device having multiple chips stacked on each other, and also enables further reduction in signal propagation distance between the chips as well as further improvement in signal propagation speed between the chips.

In the semiconductor device of the first or second aspect of the present invention, the wirings are preferably formed on an insulating layer that covers the fringe region of the main surface of the first semiconductor chip, the side surface of the second semiconductor chip and the main surface of the second semiconductor chip. Moreover, the wirings are preferably connected to the first electrodes and the second electrodes via contact holes formed in the insulating layer.

This enables the wirings for connecting the first electrodes to the second electrodes to be electrically insulated from the side surface of the second semiconductor chip.

In the semiconductor device of the first or second aspect of the present invention, the second semiconductor chip preferably has the second electrodes on a fringe region of the main surface thereof. Preferably, the semiconductor device further includes a third semiconductor chip smaller in area than the second semiconductor chip and having third electrodes on a main surface thereof. The first semiconductor chip, the second semiconductor chip and the third semiconductor chip are preferably connected together by bonding a surface of the third semiconductor chip that is opposite to the main surface thereof to a region of the main surface of the second semiconductor chip other than the fringe region. The second electrodes are preferably connected to the third electrodes by other wirings formed over the main surface of the second semiconductor chip, a side surface of the third semiconductor chip and the main surface of the third semiconductor chip.

This enables implementation of a high-speed semiconductor device having three chips stacked on each other.

According to a third aspect of the present invention, a method for manufacturing a semiconductor device including a first semiconductor chip having first electrodes on a fringe region of a main surface thereof, and a second semiconductor chip smaller in area than the first semiconductor chip and having second electrodes on a main surface thereof includes the following steps: a first step of preparing a first semiconductor wafer having a plurality of first semiconductor chips; a second step of preparing a second semiconductor wafer having a plurality of second semiconductor chips; a third step of cutting the second semiconductor wafer into the second semiconductor chips with a dicing blade while tapering ends of each second semiconductor chip in a forward direction; a fourth step of connecting the first semiconductor wafer and the second semiconductor chips together by bonding a surface of each second semiconductor chip that is opposite to the main surface thereof to a region of the main surface of a corresponding first semiconductor chip of the first semiconductor wafer other than the fringe region; a fifth step of forming a conductive film on the resultant first semiconductor wafer and patterning the conductive film to form wirings for connecting the first electrodes of each first semiconductor chip to the second electrodes of a corresponding second semiconductor chip; and a sixth step of cutting the resultant first semiconductor wafer into the first semiconductor chips as stacked-chip elements each having the first and second semiconductor chips stacked on each other.

The semiconductor device of the second aspect of the present invention can be manufactured by the manufacturing method of the third aspect of the present invention. Accordingly, the same effects as those obtained in the semiconductor device of the second aspect of the present invention can be obtained. In the third aspect of the present invention, after the second semiconductor chip is stacked on each first semiconductor chip of the first semiconductor wafer at a wafer level, the wirings for connecting the first electrodes of each first semiconductor chip of the first semiconductor wafer to the second electrodes of a corresponding second semiconductor chip are formed at a wafer level. This enables the manufacturing process of the semiconductor device to be conducted at a wafer level, and also enables the mounting step to be conducted successively to the wafer diffusion step (the step of forming elements such as transistors, wirings, interlayer films and the like at a wafer level). This allows for efficient manufacturing of the semiconductor device.

In the manufacturing method according to the third aspect of the present invention, the third step preferably includes the step of processing the ends of each second semiconductor chip so that a side surface of the second semiconductor chip forms an angle of 30 degrees to less than 90 degrees with respect to a rear surface thereof.

This enables the same effects as those obtained in the semiconductor device of the second aspect of the present invention to be obtained reliably, and prevents cracks, chippings or the like from being produced in the side portion of the second semiconductor chip.

Preferably, the manufacturing method according to the third aspect of the present invention further includes, between the second and third steps, the step of grinding the second semiconductor wafer from a side opposite to the main surface of each second semiconductor chip so that each second semiconductor chip has a thickness of 0.15 mm or less.

This reduces the difference in level between the main surface of the first semiconductor chip and the main surface of the second semiconductor chip. This facilitates a lithography process for forming the wirings for connecting the first electrodes to the second electrodes, thereby increasing a process margin. Moreover, this enables further reduction in size of a semiconductor device having multiple chips stacked on each other, and also enables further reduction in signal propagation distance between the chips as well as further improvement in signal propagation speed between the chips.

Preferably, the manufacturing method of the third aspect of the present invention further includes, between the fourth and fifth steps, the steps of forming an insulating layer that covers the fringe region of the main surface of each first semiconductor chip, a side surface of each second semiconductor chip, and the main surface of each second semiconductor chip, and forming in the insulating layer first contact holes reaching the first electrodes of each first semiconductor chip and second contact holes reaching the second electrodes of each second semiconductor chip. The fifth step preferably includes the step of forming the conductive film on the insulating layer so as to fill the first contact holes and the second contact holes.

This enables the wirings for connecting the first electrodes to the second electrodes to be electrically insulated from the side surface of the second semiconductor chip.

BRIEF DESCRIPTION OF THE DRAWINGS

FIGS. 4A, 4B and 4C are cross-sectional views illustrating main steps of the method for manufacturing the semiconductor device according to the first embodiment of the present invention;

DESCRIPTION OF THE PREFERRED EMBODIMENTS

First Embodiment

Hereinafter, a semiconductor device according to the first embodiment of the present invention and a manufacturing method thereof will be described.

Figure 1A:
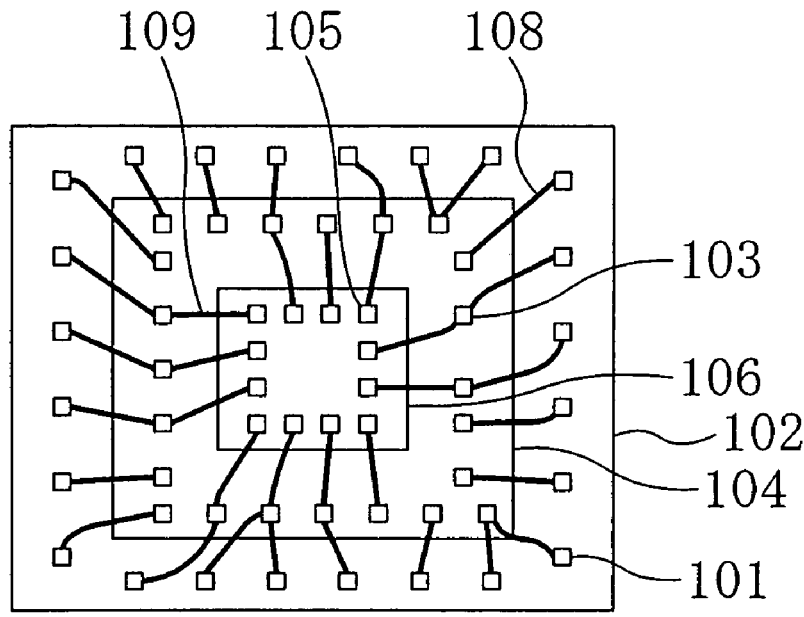
FIG. 1A is a plan view of a stacked-chip element mounted in a semiconductor device according to a first embodiment of the present invention.

First, the structure of a stacked-chip element mounted in a single package in a semiconductor device of the first embodiment (hereinafter, referred to as "stacked-chip element of the present embodiment") will be described with reference to the accompanying drawings. FIG. 1A is a plan view of the stacked-chip element of the present embodiment, and FIG. 1B is a cross-sectional view of an electrode portion of the stacked-chip element of the present embodiment.

Figure 1B:
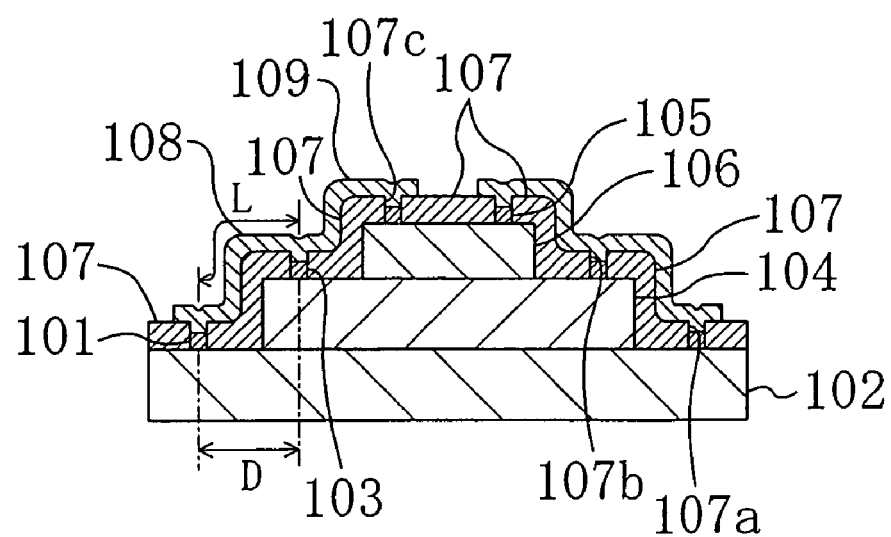
FIG. 1B is a cross-sectional view of an electrode portion of the stacked-chip element.

Referring to FIGS. 1A, 1B, the stacked-chip element of the present embodiment includes a first semiconductor chip 102, a second semiconductor chip 104 and a third semiconductor chip 106. The first semiconductor chip 102 has first electrodes 101 on the fringe region of its main surface. The second semiconductor chip 104 is smaller in area than the first semiconductor chip 102 and has second electrodes 103 on the fringe region of its main surface. The third semiconductor chip 106 is smaller in area than the second semiconductor chip 104 and has third electrodes 105 on the fringe region of its main surface. The first semiconductor chip 102, the second semiconductor chip 104 and the third semiconductor chip 106 are bonded together in the following manner: the surface of the second semiconductor chip 104 that is opposite to the main surface thereof is bonded to a region of the main surface of the first semiconductor chip 102 other than the fringe region with an insulating adhesive. Moreover, the surface of the third semiconductor chip 106 that is opposite to the main surface thereof is bonded to a region of the main surface of the second semiconductor chip 104 other than the fringe region with an insulating adhesive. The first semiconductor chip 102, the second semiconductor chip 104 and the third semiconductor chip 106 are those selected from a plurality of types of chips such as logic chip and memory chip. All signal connection electrodes are arranged in the fringe regions of the corresponding semiconductor chips. Accordingly, in the stacked-chip element of the present embodiment, the second semiconductor chip 104 is smaller in area than the first semiconductor chip 102, and the third semiconductor chip 106 is smaller than the second semiconductor chip 104.

As shown in FIGS. 1A and 1B, the main surface (fringe region) of the first semiconductor chip 102, the side surface and the main surface (fringe region) of the second semiconductor chip 104, and the side surface and the main surface of the third semiconductor chip 106 are covered with an insulating resin layer 107. The insulating resin layer 107 has first contact holes 107a reaching the respective first electrodes 101, second contact holes 107b reaching the respective second electrode 103, and third contact holes 107c reaching the respective third electrodes 105. First inter-chip wirings 108 and second inter-chip wirings 109 are formed on the insulating resin layer 107. Each of the first inter-chip wirings 108 is connected to the first electrode 101 and the second electrode 103 via the first contact hole 107a and the second contact hole 107b, respectively. Each of the second inter-chip wirings 109 is connected to the second electrode 103 and the third electrode 105 via the second contact hole 107b and the third contact hole 107c, respectively. In other words, the insulating resin layer 107 electrically insulates the first inter-chip wirings 108 from the side surface of the second semiconductor chip 104, and also insulates the second inter-chip wirings 109 from the side surface of the third semiconductor chip 106. Note that illustration of the insulating resin layer 107 is omitted in FIG. 1A.

In the stacked-chip element of the present embodiment, the first electrodes 101 are connected to the second electrodes 103 by the first inter-chip wirings 108 formed over the main surface of the first semiconductor chip 102 and the side surface and the main surface of the second semiconductor chip 104. Moreover, the second electrodes 103 are connected to the third electrodes 105 by the second inter-chip wirings 109 formed over the main surface of the second semiconductor chip 104 and the side surface and the main surface of the third semiconductor chip 106. The use of such inter-chip wirings reduces the signal propagation distance between chips and thus improves the signal propagation speed between chips as compared to the case where thin metal wires are used as means for electric connection between electrodes, that is, means for electric connection between chips. This enables improvement in operation speed of a semiconductor device having multiple chips stacked on each other. More specifically, it is clearly understood from FIG. 1B that, provided that D is the distance between the first electrode 101 and the second electrode 103 and L is the length of the first inter-chip wiring 108, the length L is shorter than the length of a thin metal wire connecting a pair of electrodes provided at a distance D.

Note that, in the stacked-chip element of the present embodiment, the first inter-chip wirings 108 and the second inter-chip wirings 109 are formed from an integrally patterned conductive film. The first electrodes 101 of the first semiconductor chip 102 function also as external electrodes for transmitting a signal with an external equipment.

Figure 2:
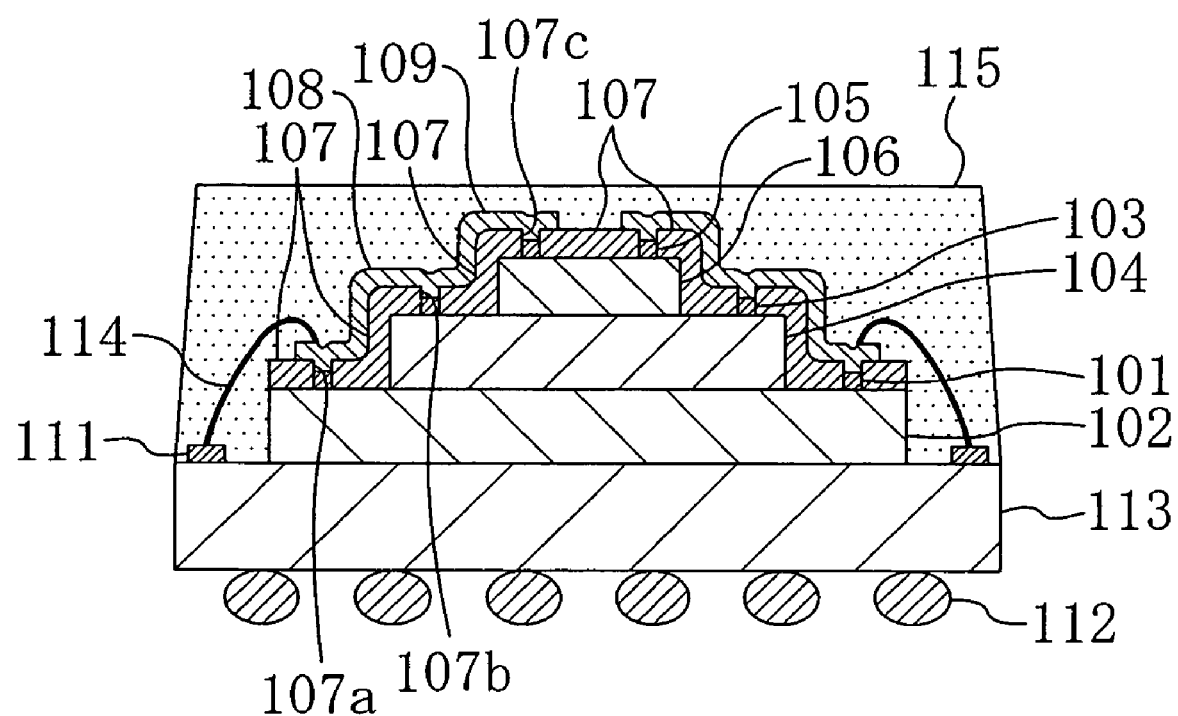
FIG. 2 is a cross-sectional view of the semiconductor device according to the first embodiment of the present invention.

Hereinafter, the semiconductor device of the first embodiment will be described. The semiconductor device of the first embodiment is a BGA (Ball Grid Array)-type semiconductor device having the stacked-chip element of the present embodiment of FIGS. 1A, 1B mounted on a circuit board. FIG. 2 is a cross-sectional view of the semiconductor device of the first embodiment.

Referring to FIG. 2, the semiconductor device of the first embodiment is a BGA-type semiconductor device using a circuit board 113. More specifically, the semiconductor device of the first embodiment includes a circuit board 113, a stacked-chip element of the present embodiment (see FIG. 1B), thin metal wires 114, and an insulating resin package 115. The circuit board 113 has wiring electrodes 111 on the fringe region of its top surface and ball-shaped external terminals 112 at its bottom surface. The stacked-chip element of the present embodiment is bonded to the top surface of the circuit board 113. The thin metal wires 114 electrically connect the first electrodes 101 of the first semiconductor chip 102 to the wiring electrodes 111, respectively. The insulating resin package 115 seals the top surface region of the circuit board 113 including the stacked-chip element of the present embodiment, the wiring electrodes 111 and the thin metal wires 114. Note that the circuit board 113 and the stacked-chip element of the present embodiment are bonded together in the following manner: the surface of the first semiconductor chip 102 that is opposite to the main surface thereof is bonded to the region of the top surface of the circuit board 113 other than the fringe region. The wiring electrodes 111 are electrically connected to the external terminals 112 via through holes formed in the wiring substrate 113, respectively.

As described above, the stacked-chip element of the present embodiment mounted in the semiconductor device of the first embodiment includes a first semiconductor chip 102, a second semiconductor chip 104 and a third semiconductor chip 106. The first semiconductor chip 102 has first electrodes 101 on the fringe region of its main surface. The second semiconductor chip 104 is smaller in area than the first semiconductor chip 102 and has second electrodes 103 on the fringe region of its main surface. The third semiconductor chip 106 is smaller in area than the second semiconductor chip 104 and has third electrodes 105 on the fringe region of its main surface. The second semiconductor chip 104 is bonded to the region of the main surface of the first semiconductor chip 102 other than the fringe region with face-up state. The third semiconductor chip 106 is bonded to the region of the main surface of the second semiconductor chip 104 other than the fringe region with face-up state. The main surface of the first semiconductor chip 102, the side surface and the main surface of the second semiconductor chip 104, and the side surface and the main surface of the third semiconductor chip 106 are covered with an insulating resin layer 107. The insulating resin layer 107 has first contact holes 107a reaching the respective first electrodes 101, second contact holes 107b reaching the respective second electrodes 103, and third contact holes 107c reaching the respective third electrodes 105. The first electrodes 101 are electrically connected to the second electrodes 103 by the first inter-chip wirings 108 formed on the side surface of the semiconductor chip 104 with the insulating resin layer 107 interposed therebetween. Moreover, the second electrodes 103 are electrically connected to the third electrodes 105 by the second inter-chip wirings 109 formed on the side surface of the third semiconductor chip 106 with the insulating resin layer 107 interposed therebetween.

More specifically, the semiconductor device of the present embodiment uses the stacked-chip element of the present embodiment mounted in a single package. This reduces the signal propagation distance between chips and thus improves the signal propagation speed between chips as compared to the case where thin metal wires are used as means for electric connection between chips. This enables improvement in operation speed of a semiconductor device having multiple chips stacked on each other.

Hereinafter, a method for manufacturing the semiconductor device according to the first embodiment, more specifically, a method for manufacturing the stacked-chip element of the present embodiment, will be described. FIGS. 3A to 3C and FIGS. 4A to 4C are cross-sectional views illustrating main steps of the method for manufacturing the semiconductor device according to the first embodiment.

Figure 3A:
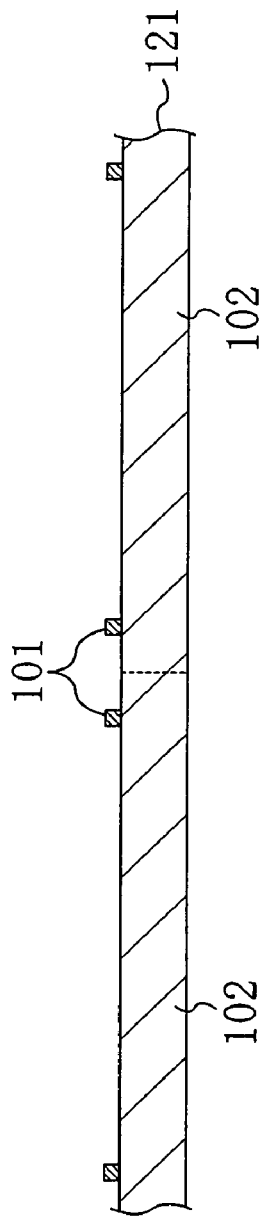
FIGS. 3A, 3B and 3C are cross-sectional views illustrating main steps of a method for manufacturing the semiconductor device according to the first embodiment of the present invention.

As shown in FIG. 3A, a first semiconductor wafer 121 is prepared. The first semiconductor wafer 121 has a plurality of first semiconductor chips 102 each having first electrodes 101 on the fringe region of its main surface. Note that, in FIGS. 3A to 3C and FIGS. 4A, 4B, dashed line indicates a scribe line along which the first semiconductor wafer 121 is cut into individual first semiconductor chips 102.

Figure 3B:
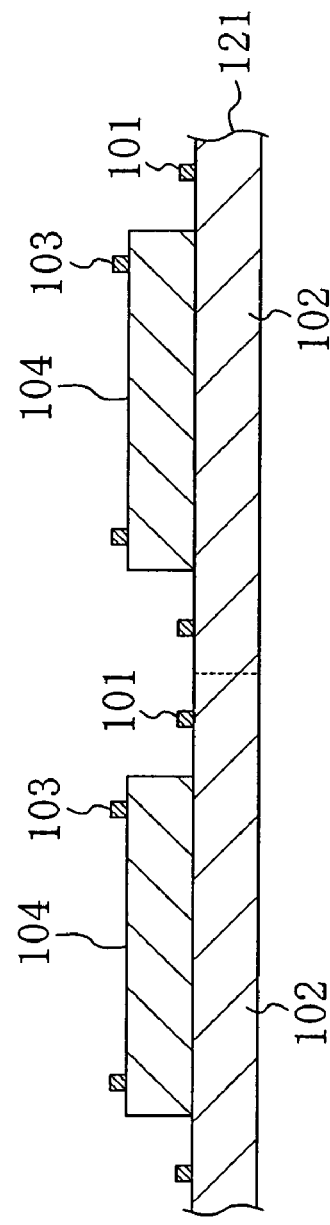

As shown in FIG. 3B, a second semiconductor chip 104 is prepared for every first semiconductor chip 102. Each of the second semiconductor chips 104 is smaller in area than the first semiconductor chip 102 and has second electrodes 103 on the fringe region of its main surface. Each of the second semiconductor chips 104 is bonded to a corresponding first semiconductor chip 102 of the first semiconductor wafer 121 with an insulating adhesive or the like so as to expose the first electrodes 101. More specifically, the surface of the second semiconductor chip 104 that is opposite to the main surface thereof is bonded to the central region of the main surface of the corresponding first semiconductor chip 102 in the first semiconductor wafer 121. The first semiconductor wafer 121 and the second semiconductor chips 104 are thus bonded together.

Figure 3C:
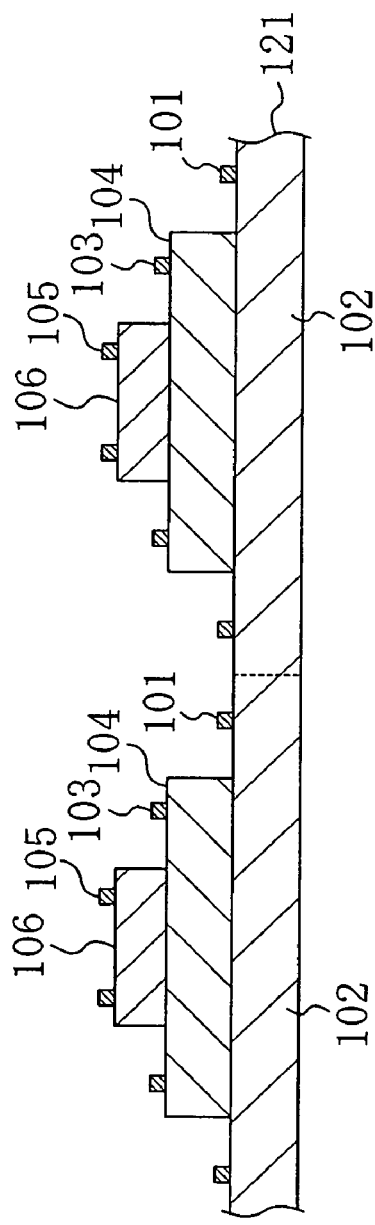

As shown in FIG. 3C, a third semiconductor chip 106 is prepared for every first semiconductor chip 102. Each of the third semiconductor chips 106 is smaller in area than the second semiconductor chip 104 and has third electrodes 105 on the fringe region of its main surface. Each of the third semiconductor chips 106 is bonded to a corresponding second semiconductor chip 104 on the first semiconductor wafer 121 with an insulating adhesive or the like so as to expose the second electrodes 103. More specifically, the surface of the third semiconductor chip 106 that is opposite to the main surface thereof is bonded to the central region of the main surface of the corresponding second semiconductor chip 104 on the first semiconductor wafer 121. The first semiconductor wafer 121, the second semiconductor chips 104 and the third semiconductor chips 106 are thus bonded together.

A photosensitive insulating material is then applied to the first semiconductor wafer 121 so as to cover the main surfaces of the first semiconductor chips 102, the side surfaces and the main surfaces of the second semiconductor chips 104, and the side surfaces and the main surfaces of the third semiconductor chips 106. A prescribed part of the applied photosensitive insulating material is then exposed to light for curing. An unnecessary part of the photosensitive insulating material is then removed. As a result, as shown in FIG. 4A, an insulating resin layer 107 is formed which has first contact holes 107a reaching the respective first electrodes 101, second contact holes 107b reaching the respective second electrodes 103, and third contact holes 107c reaching the respective third electrodes 105. Note that the photosensitive insulating material as the insulating resin layer 107 may be applied by a commonly used spin coating method. Alternatively, another method such as a spray method or a printing method may be used.

Thereafter, a conductive film is formed on the insulating resin layer 107 so as to fill the first contact holes 107a, the second contact holes 107b and the third contact holes 107c. The conductive film thus formed is then patterned to form first inter-chip wirings 108 and second inter-chip wirings 109, as shown in FIG. 4B Each of the first inter-chip wirings 108 connects a corresponding first electrode 101 of a corresponding first semiconductor chip 102 to a corresponding second electrode 103 of a corresponding second semiconductor chip 104. Each of the second inter-chip wirings 109 connects a corresponding second electrode 103 of a corresponding second semiconductor chip 104 to a corresponding third electrode 105 of a corresponding third semiconductor chip 106. In other words, the first semiconductor chip 102 and the second semiconductor chip 104 are electrically connected to each other by the first inter-chip wirings 108 formed over the main surface of the first semiconductor chip 102 and the side surface and the main surface of the second semiconductor chip 104. The insulating resin layer 107 electrically insulates the first inter-chip wirings 108 from the side surface of the second semiconductor chip 104. Moreover, the second semiconductor chip 104 and the third semiconductor chip 106 are electrically connected to each other by the second inter-chip wirings 109 formed over the main surface of the second semiconductor chip 104 and the side surface and the main surface of the third semiconductor chip 106. The insulating resin layer 107 electrically insulates the second inter-chip wirings 109 from the side surface of the third semiconductor chip 106.

For example, the first inter-chip wirings 108 and the second inter-chip wirings 109 may be formed by a semi-additive method, one of the existing technologies. More specifically, a metal barrier layer and a plating seed layer are sequentially formed on the insulating resin layer 107 on the first semiconductor wafer 121 by a sputtering method, and a resist pattern is formed on the plating seed layer. Thereafter, by an electroplating method, a thick metal film is selectively formed on the region of the plating seed layer having no resist pattern, and the resist pattern is then removed. The plating seed layer and the metal barrier layer are then etched away using the thick metal film as a mask. As a result, the first inter-chip wirings 108 and the second inter-chip wirings 109 are formed. Note that a metal having an excellent adhesion property to the insulting resin layer 107 and the plating seed layer and serving as a barrier against an etchant of the plating seed layer, e.g., TiW, is used as a material of the metal barrier layer. A low-resistance metal allowing electroplating to be conducted in an excellent manner, e.g., Cu, is used as a material of the plating seed layer. In view of electric characteristics of the first and second inter-chip wirings 108, 109, a low-resistance, non-magnetic metal, e.g., Cu, is used as a material of the thick metal film (i.e., plated metal film).

The first semiconductor wafer 121 is then cut into a plurality of first semiconductor chips 102 with a dicing blade. As a result, the same stacked-chip element as that of the present embodiment in FIG. 1B is completed as shown in FIG. 4C. More specifically, the second semiconductor chip 104 and the third semiconductor chip 106 are stacked on each first semiconductor chip 102, and the first, second and third semiconductor chips 102, 104, 106 of each stacked-chip element are electrically connected to each other by the first inter-chip wirings 108 and the second inter-chip wirings 109.

As has been described above, according to the first embodiment, the second semiconductor chip 104 is bonded to the main surface of the first semiconductor chip 102 with face-up state. The first electrodes 101 on the main surface of the first semiconductor chip 102 are connected to the second electrodes 103 on the main surface of the second semiconductor chip 104 by the first inter-chip wirings 108 formed over the side surface of the second semiconductor chip 104. Moreover, the third semiconductor chip 106 is bonded to the main surface of the second semiconductor chip 104 with face-up state. The second electrodes 103 on the main surface of the second semiconductor chip 104 are connected to the third electrodes 105 on the main surface of the third semiconductor chip 106 by the second inter-chip wirings 109 formed over the side surface of the third semiconductor chip 106. This reduces the signal propagation distance between chips and thus improves the signal propagation speed between chips as compared to the case where thin metal wires are used as means for electric connection between electrodes, i.e., between chips. This results in an improved signal transmission speed between a semiconductor device having multiple chips (more specifically, three chips) stacked on each other and an external equipment connected thereto.

The first embodiment is implemented based on the difference in area between the semiconductor chips. More specifically, the second semiconductor chip 104 and the third semiconductor chip 106 are sequentially stacked on each first semiconductor chip 102 of the first semiconductor wafer 121 at a wafer level. Thereafter, the first inter-chip wirings 108 and the second inter-chip wirings 109 for electric connection between chips are formed at a wafer level. This enables the manufacturing process of the semiconductor device to be conducted at a wafer level, and also enables the mounting step to be conducted successively to the wafer diffusion step (the step of forming elements such as transistors, wirings, interlayer films and the like at a wafer level). This allows for efficient manufacturing of the semiconductor device.

Note that a semiconductor device having three chips stacked on each other is described in the first embodiment. However, a semiconductor device having two chips or four or more chips stacked on each other may alternatively be used as long as an upper semiconductor chip has a smaller area and each semiconductor chip has signal connection electrodes on the fringe region thereof. The same effects as those described above can be obtained by such a semiconductor device.

In the first embodiment, the stacked-chip element is mounted in a BGA-type semiconductor device by using a circuit board. However, the stacked-chip element may be mounted in a QFP (Quad Flat Package) or a QFN (Quad Flat Non-leaded Package) by using a lead frame. Alternatively, the stacked-chip element may be mounted in a TCP (Tape Carrier Package) by a TAB (Tape Automated Bonding) technology. In such cases as well, a high-speed semiconductor device having a stacked-chip element mounted in a single package can be implemented.

Conventionally, a semiconductor chip having a thickness of about 0.15 mm to about 0.60 mm is commonly mounted in a semiconductor device. In the first embodiment, however, it is preferable that the total thickness of the second and third semiconductor chips 104, 106 is about 0.15 mm or less. In other words, it is preferable to grind a semiconductor wafer having the second semiconductor chips 104 before dicing it into individual second semiconductor chips 104, and to grind a semiconductor wafer having the third semiconductor chips 106 before dicing it into individual third semiconductor chips 106. More specifically, the semiconductor wafer having the second semiconductor chips 104 is ground from the side opposite to the main surface of the second semiconductor chips 104 and the semiconductor wafer having the third semiconductor chips 106 is ground from the side opposite to the main surface of the third semiconductor chips 106 so that the total thickness of the second and third semiconductor chips 104, 106 becomes equal to about 0.15 mm or less. This reduces the difference in level between the respective main surfaces of the first and second semiconductor chips 102, 104 and also reduces the difference in level between the respective main surfaces of the second and third semiconductor chips 104, 106. This facilitates a lithography process for forming the first and second inter-chip wirings 108, 109, thereby increasing a process margin. In order to form the wirings in a desirable manner, the resist film must be applied with a thickness of at most about 0.15 mm. This requires that the distance from the main surface of the first semiconductor chip 102 to the main surface of the third semiconductor chip 106 be about 0.15 mm or less. It is difficult to form a resist pattern with an aspect ratio (i.e., the ratio of height to width) exceeding five. Therefore, each of the first and second inter-chip wirings 108, 109 must have a width of 0.02 mm or more. In other words, each of the first and second inter-chip wirings 108, 109 is a flat wiring with an aspect ratio of less than one. Accordingly, in a semiconductor device having two chips stacked on each other, it is preferable that the upper semiconductor chip has a thickness of about 0.15 mm or less. In a semiconductor device having four or more chips stacked on each other, it is preferable that the total thickness of the second semiconductor chip from the bottom and the semiconductor chips stacked thereon is about 0.15 mm or less.

Reducing the total thickness of the second and third semiconductor chips 104, 106 in the first embodiment would enable further reduction in size of a semiconductor device having multiple chips stacked on each other, and also enable further reduction in signal propagation distance between chips as well as further improvement in signal propagation speed between chips.

In the first embodiment, a semiconductor wafer to be cut into the second or third semiconductor chips 104, 106 may be reduced in thickness by the following method: a semiconductor wafer having a thickness of about 0.50 mm to about 0.80 mm is first ground to about 0.15 mm to about 0.30 mm by a machining process. An example of the machining process is an infeed grinding method, a two-step grinding method using a grinding stone (rough machining step and finishing step). The resultant semiconductor wafer is further reduced in thickness to about 0.02 mm to about 0.08 mm by a chemical etching method, a CMP (Chemical Mechanical Polishing) method, or the like. The reason why the chemical etching method or the CMP method is used is as follows: as the wafer thickness is reduced to 0.08 mm or less, it becomes difficult to grind the semiconductor wafer by a machining process in view of stresses, strength or the like.

In the first embodiment, the first and second inter-chip wirings 108, 109 are formed by a semi-additive method. However, the first and second inter-chip wirings 108, 109 may alternatively be formed by another existing wiring formation technology, e.g., a sputtering method.

Second Embodiment

Hereinafter, a semiconductor device according to the second embodiment of the present invention and a manufacturing method thereof will be described.

Figure 5A:
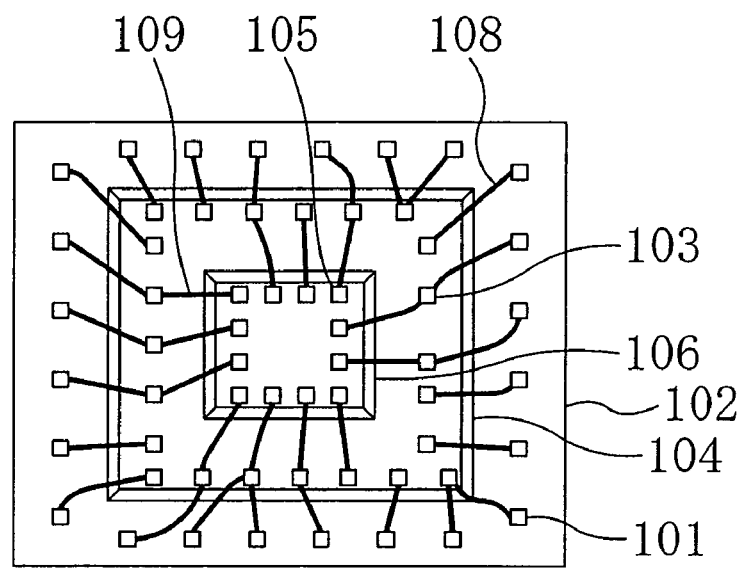
FIG. 5A is a plan view of a stacked-chip element mounted in a semiconductor device according to a second embodiment of the present invention.
Figure 5B:
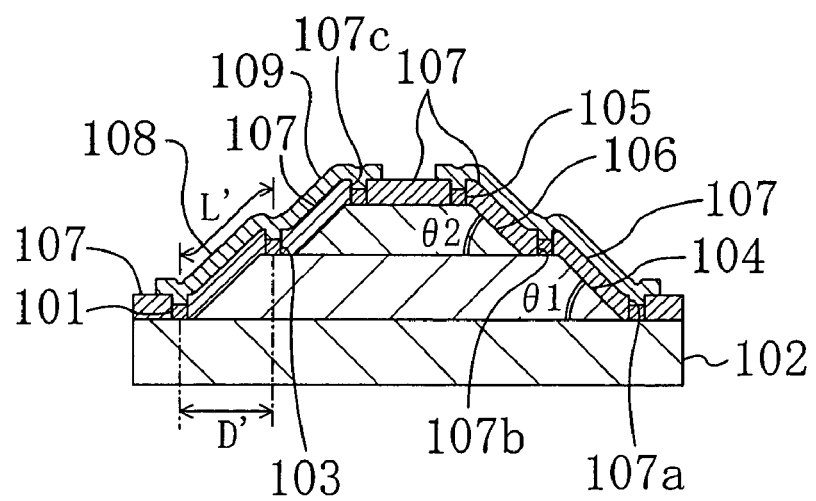
FIG. 5B is a cross-sectional view of an electrode portion of the stacked-chip element.

First, the structure of a stacked-chip element mounted in a single package in the semiconductor device of the second embodiment (hereinafter, referred to as "stacked-chip element of the present embodiment") will be described with reference to the accompanying drawings. FIG. 5A is a plan view of the stacked-chip element of the present embodiment. FIG. 5B is a cross-sectional view of an electrode portion of the stacked-chip element of the present embodiment. Note that, in FIGS. 5A, 5B, the same members as those of the stacked-chip element mounted in the semiconductor device of the first embodiment in FIGS. 1A, 1B are denoted with the same reference numerals and characters, and description thereof will be omitted.

As shown in FIGS. 5A, 5B, the stacked-chip element of the present embodiment is different from that of the first embodiment in that the side surface of the second semiconductor chip 104 has an inclination of less than 90 degrees with respect to the main surface of the first semiconductor chip 102, and in that the side surface of the third semiconductor chip 106 has an inclination of less than 90 degrees with respect to the main surface of the second semiconductor chip 104. This reduces both the length of the first inter-chip wiring 108 connecting the first electrode 101 to the second electrode 103 and the length of the second inter-chip wiring 109 connecting the second electrode 103 to the third electrode 105 as compared to the first embodiment. More specifically, it is clearly understood from FIGS. 5B, 1B that, provided that the distance D' between the first and second electrodes 101, 103 of the present embodiment is the same as the distance D between the first and second electrodes 101, 103 of the first embodiment (see FIG. 1B), the length L' of the first inter-chip wiring 108 of the present embodiment is shorter than the length L of the first inter-chip wiring 108 of the first embodiment. In FIG. 5B, θ1 denotes an angle of the side surface of the second semiconductor chip 104 with respect to the main surface of the first semiconductor chip 102, and θ2 denotes an angle of the side surface of the third semiconductor chip 106 with respect to the main surface of the second semiconductor chip 104. The upper limit of θ1 and θ2 is about 90 degrees in view of the limitations on coverage of the insulating resin layer 107, sputtering coverage of the plating seed layer (see the method for forming the first and second inter-chip wirings 108, 109 in the first embodiment) or the like. The lower limit of θ1 and θ2 is about 30 degrees in view of the limitations on the blade angle of a dicing blade for cutting semiconductor wafers into second semiconductor chips 104 and third semiconductor chips 106. In the stacked-chip element of the present embodiment, θ1 and θ2 are about 45 degrees. When θ1 and θ2 are 90 degrees, the stacked-chip element of the present embodiment is the same as that mounted in the semiconductor device of the first embodiment in FIGS. 1A, 1B. Note that illustration of the insulting resin layer 107 is omitted in FIG. 5A.

Figure 6:
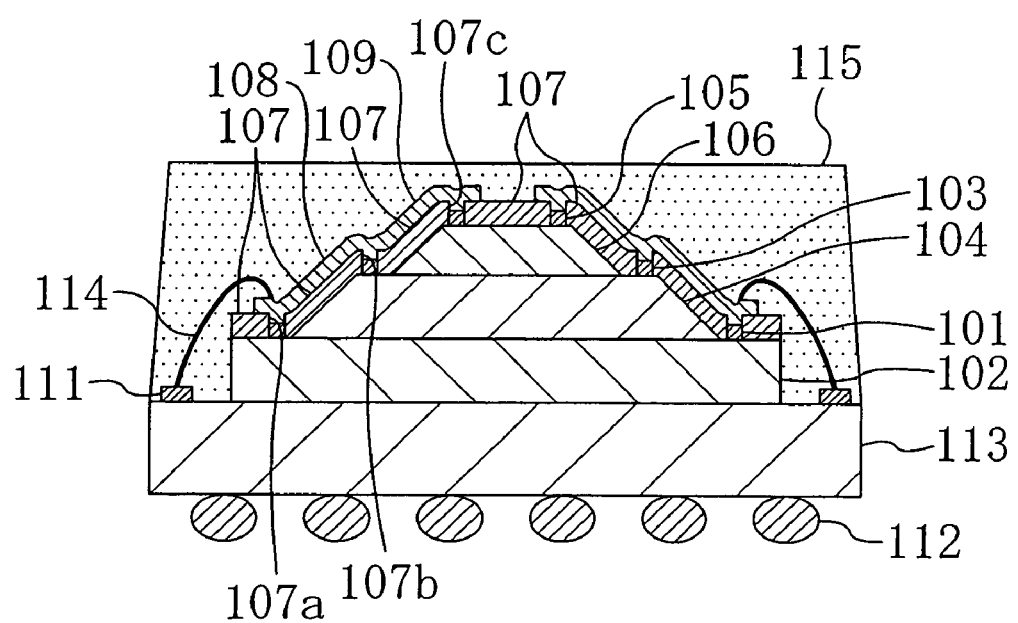
FIG. 6 is a cross-sectional view of the semiconductor device according to the second embodiment of the present invention.

Hereinafter, a semiconductor device of the second embodiment will be described. The semiconductor device of the second embodiment is a BGA-type semiconductor device having the stacked-chip element of the present embodiment of FIGS. 5A, 5B mounted on a circuit board. FIG. 6 is a cross-sectional view of a semiconductor device of the second embodiment. Note that, in FIG. 6, the same members as those in the semiconductor device of the first embodiment in FIG. 2 are denoted with the same reference numerals and characters, and description thereof will be omitted. As shown in FIG. 6, the semiconductor device of the second embodiment is different from that of the first embodiment in that each of the side surface of the second semiconductor chip 104 and the side surface of the third semiconductor chip 106 has an inclination of less than 90 degrees with respect to the main surface of the underlying semiconductor chip.

Hereinafter, a method for manufacturing the semiconductor device of the second embodiment, more specifically, a method for manufacturing the stacked-chip element of the present embodiment, will be described. FIGS. 7A to 7C, FIGS. 8A to 8C and FIGS. 9A to 9C are cross-sectional views illustrating main steps of the method for manufacturing the semiconductor device of the second embodiment.

Figure 7A:
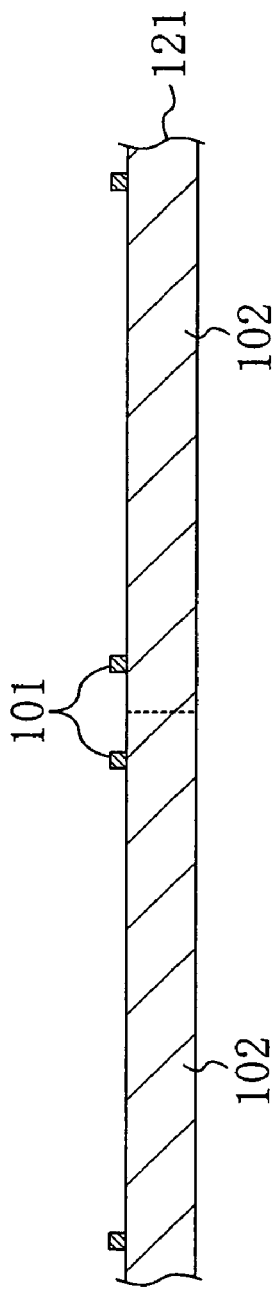
FIGS. 7A, 7B and 7C are cross-sectional views illustrating main steps of a method for manufacturing the semiconductor device according to the second embodiment of the present invention.

As shown in FIG. 7A, a first semiconductor wafer 121 is prepared. The first semiconductor wafer 121 has a plurality of first semiconductor chips 102 each having first electrodes 101 on the fringe region of its main surface. Note that, in FIG. 7A, FIGS. 8B, 8C and FIGS. 9A, 9B, dashed line indicates a scribe line along which a first semiconductor wafer 121 is cut into individual first semiconductor chips 102.

Figure 7B:
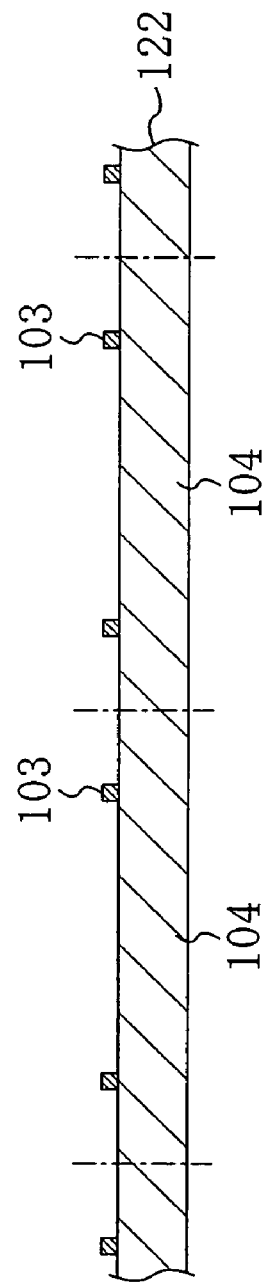
Figure 7C:
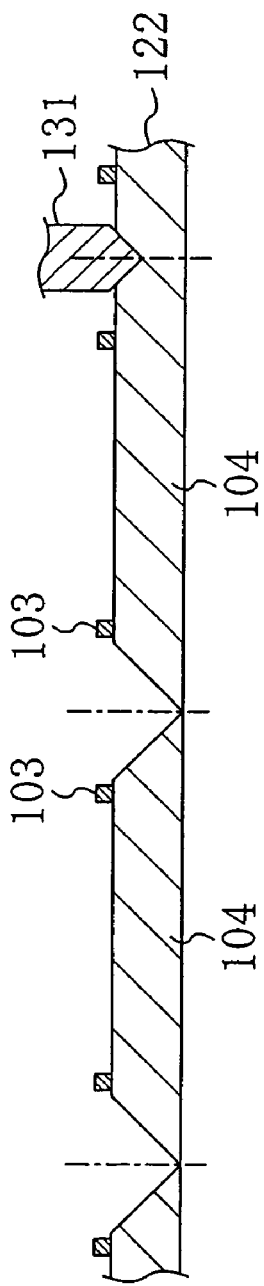
Figure 8A:
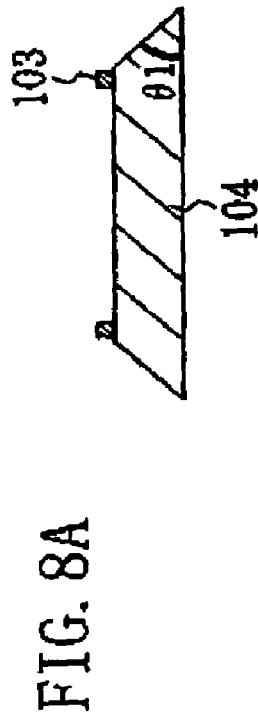
FIGS. 8A, 8B and 8C are cross-sectional views illustrating main steps of the method for manufacturing the semiconductor device according to the second embodiment of the present invention.

As shown in FIG. 7B, a second semiconductor wafer 122 is prepared. The second semiconductor wafer 122 has a plurality of second semiconductor chips 104. Each of the plurality of second semiconductor chips 104 is smaller in area than the first semiconductor chip 102 and has second electrodes 103 on the fringe region of its main surface. As shown in FIG. 7C, the second semiconductor wafer 122 is then cut into the second semiconductor chips 104 with a dicing blade 131 having a prescribed blade angle. As shown in FIG. 8A, when the second semiconductor wafer 122 is cut into the second semiconductor chips 104, both ends of each second semiconductor chip 104 are tapered in the forward direction. In other words, both ends of each second semiconductor chip 104 are processed so that the side surface of the second semiconductor chip 104 forms an angle θ1 of less than 90 degrees with respect to the rear surface thereof. Note that chain line in FIGS. 7B, 7C indicates a scribe line along which the second semiconductor wafer 122 is cut into individual second semiconductor chips 104.

Figure 8B:
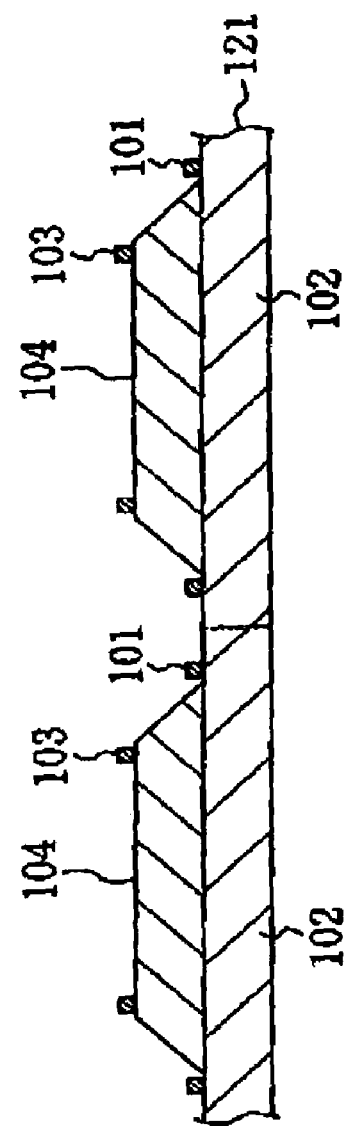

As shown in FIG. 8B, each of the second semiconductor chips 104 is bonded to a corresponding first semiconductor chip 102 of the first semiconductor wafer 121 with an insulating adhesive or the like so as to expose the first electrodes 101. More specifically, the surface of the second semiconductor chip 104 that is opposite to the main surface thereof is bonded to the central region of the main surface of the corresponding first semiconductor chip 102 in the first semiconductor wafer 121. The first semiconductor wafer 121 and the second semiconductor chips 104 are thus bonded together.

Figure 8C:
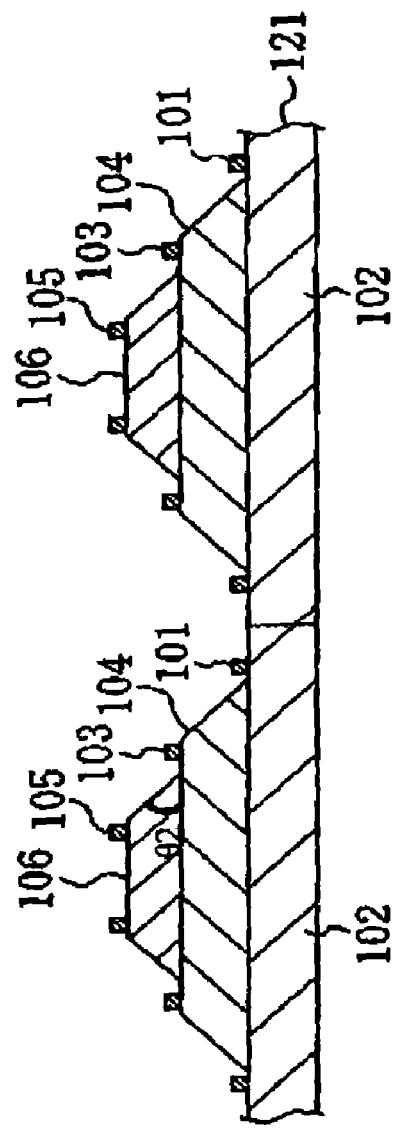

Thereafter, a third semiconductor wafer (not shown) is prepared. The third semiconductor wafer has a plurality of third semiconductor chips 106. Each of the third semiconductor chips 106 is smaller in area than the second semiconductor chip 104 and has third electrodes 105 on the fringe region of its main surface. The third semiconductor wafer is then cut into the third semiconductor chips 106 in the same manner as that shown in FIGS. 7B, 7C and FIG. 8A so that both ends of each third semiconductor chip 106 are tapered in the forward direction. As a result, the side surface of the third semiconductor chip 106 forms an angle θ2 of less than 90 degrees with respect to the rear surface thereof. As shown in FIG. 8C, each of the third semiconductor chips 106 is bonded to a corresponding second semiconductor chip 104 on the first semiconductor wafer 121 with an insulating adhesive or the like so as to expose the second electrodes 103. More specifically, the surface of the third semiconductor chip 106 that is opposite to the main surface thereof is bonded to the central region of the main surface of the corresponding second semiconductor chip 104 on the first semiconductor wafer 121. The first semiconductor wafer 121, the second semiconductor chips 104 and the third semiconductor chips 106 are thus bonded together.

Figure 9A:
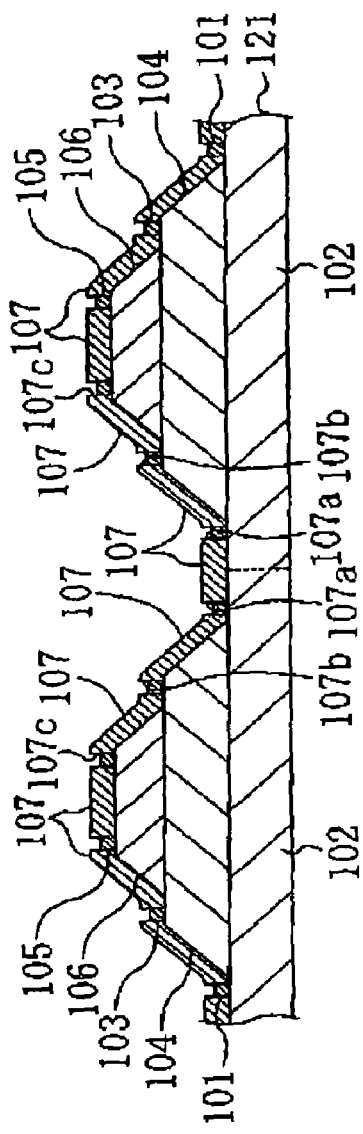
FIGS. 9A, 9B and 9C are cross-sectional views illustrating main steps of the method for manufacturing the semiconductor device according to the second embodiment of the present invention.

A photosensitive insulating material is then applied to the first semiconductor wafer 121 so as to cover the main surfaces of the first semiconductor chips 102, the side surfaces and the main surfaces of the second semiconductor chips 104, and the side surfaces and the main surfaces of the third semiconductor chips 106. A prescribed part of the applied photosensitive insulating material is then exposed to light for curing. An unnecessary part of the photosensitive insulating material is then removed. As a result, as shown in FIG. 9A, an insulating resin layer 107 is formed which has first contact holes 107a reaching the respective first electrodes 101, second contact holes 107b reaching the respective second electrodes 103, and third contact holes 107c reaching the respective third electrodes 105. Note that the photosensitive insulating material as the insulating resin layer 107 may be applied by a commonly used spin coating method. Alternatively, another method such as a spray method or a printing method may be used.

Figure 9B:
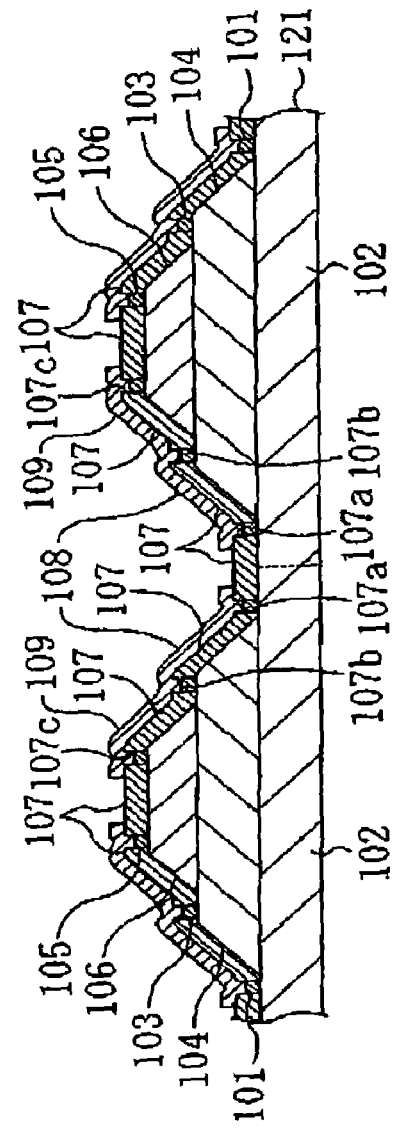

Thereafter, a conductive film is formed on the insulating resin layer 107 so as to fill the first contact holes 107a, the second contact holes 107b and the third contact holes 107c. The conductive film thus formed is then patterned to form first inter-chip wirings 108 and second inter-chip wirings 109, as shown in FIG. 9B Each of the first inter-chip wirings 108 connects a corresponding first electrode 101 of a corresponding first semiconductor chip 102 to a corresponding second electrode 103 of a corresponding second semiconductor chip 104. Each of the second inter-chip wirings 109 connects a corresponding second electrode 103 of a corresponding second semiconductor chip 104 to a corresponding third electrode 105 of a corresponding third semiconductor chip 106. In other words, the first semiconductor chip 102 and the second semiconductor chip 104 are electrically connected to each other by the first inter-chip wirings 108 formed over the main surface of the first semiconductor chip 102 and the side surface and the main surface of the second semiconductor chip 104. The insulating resin layer 107 electrically insulates the first inter-chip wirings 108 from the side surface of the second semiconductor chip 104. Moreover, the second semiconductor chip 104 and the third semiconductor chip 106 are electrically connected to each other by the second inter-chip wirings 109 formed over the main surface of the second semiconductor chip 104 and the side surface and the main surface of the third semiconductor chip 106. The insulating resin layer 107 electrically insulates the second inter-chip wirings 109 from the side surface of the third semiconductor chip 106.

Figure 9C:
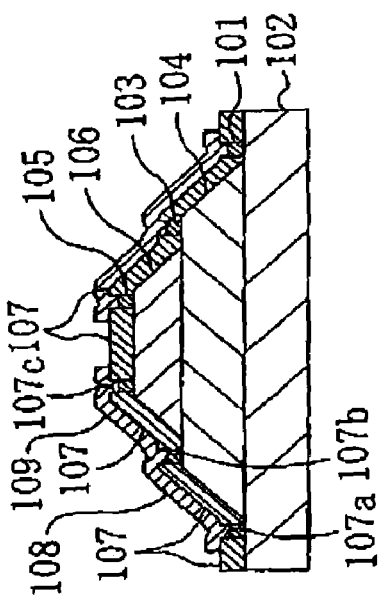
Figure 10:
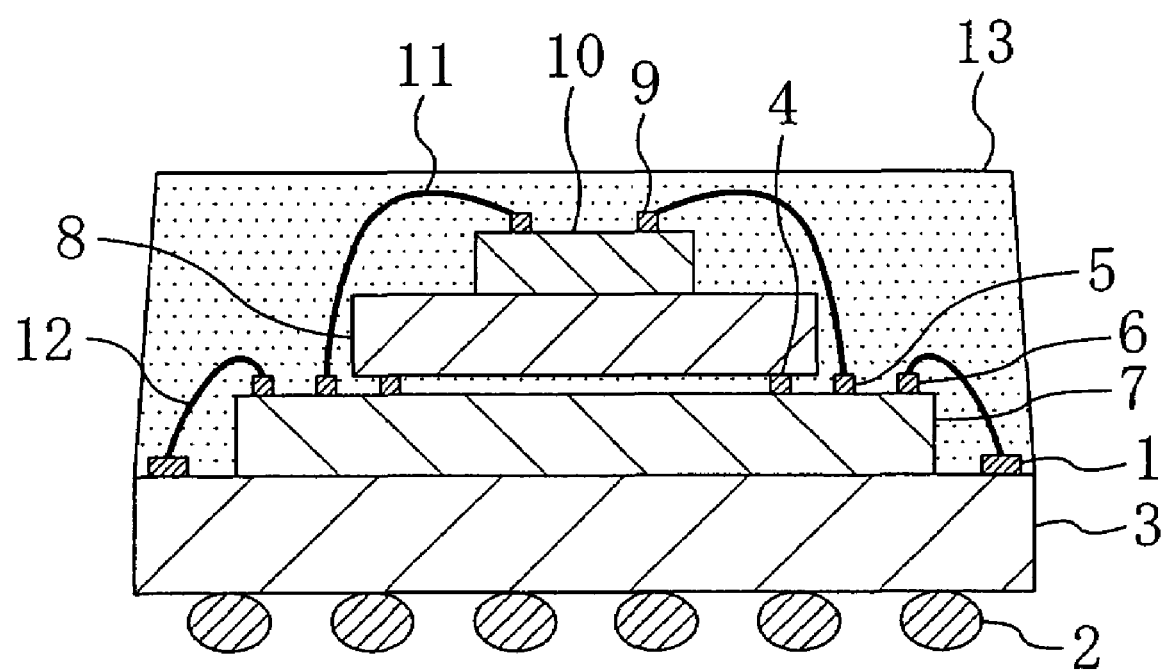
FIG. 10 is a cross-sectional view of a conventional semiconductor device.

The first semiconductor wafer 121 is then cut into a plurality of first semiconductor chips 102 with a dicing blade. As a result, the same stacked-chip element as that of the present embodiment in FIG. 5B is completed as shown in FIG. 9C. More specifically, the second semiconductor chip 104 and the third semiconductor chip 106 are stacked on each first semiconductor chip 102, and the first, second and third semiconductor chips 102, 104, 106 of each stacked-chip element are electrically connected to each other by the first inter-chip wirings 108 and the second inter-chip wirings 109.

As has been described above, according to the second embodiment, the second semiconductor chip 104 is bonded to the main surface of the first semiconductor chip 102 with face-up state. The first electrodes 101 on the main surface of the first semiconductor chip 102 are connected to the second electrodes 103 on the main surface of the second semiconductor chip 104 by the first inter-chip wirings 108 formed over the side surface of the second semiconductor chip 104. Moreover, the third semiconductor chip 106 is bonded to the main surface of the second semiconductor chip 104 with face-up state. The second electrodes 103 on the main surface of the second semiconductor chip 104 are connected to the third electrodes 105 on the main surface of the third semiconductor chip 106 by the second inter-chip wirings 109 formed over the side surface of the third semiconductor chip 106. This reduces the signal propagation distance between chips and thus improves the signal propagation speed between chips as compared to the case where thin metal wires are used as means for electric connection between electrodes, i.e., between chips. This results in an improved signal transmission speed between a semiconductor device having multiple chips (more specifically, three chips) stacked on each other and an external equipment connected thereto.

The second embodiment is implemented based on the difference in area between the semiconductor chips. More specifically, the second semiconductor chip 104 and the third semiconductor chip 106 are sequentially stacked on each first semiconductor chip 102 of the first semiconductor wafer 121 at a wafer level. Thereafter, the first inter-chip wirings 108 and the second inter-chip wirings 109 for electric connection between chips are formed at a wafer level. This enables the manufacturing process of the semiconductor device to be conducted at a wafer level, and also enables the mounting step to be conducted successively to the wafer diffusion step. This allows for efficient manufacturing of the semiconductor device.

According to the second embodiment, the side surface of the second semiconductor chip 104 has an inclination of less than 90 degrees with respect to the main surface of the first semiconductor chip 102. This reduces the length of the first inter-chip wiring 108 as compared to the case where the side surface of the second semiconductor chip 104 is vertical to the main surface of the first semiconductor chip 102. Similarly, the side surface of the third semiconductor chip 106 has an inclination of less than 90 degrees with respect to the main surface of the second semiconductor chip 104. This reduces the length of the second inter-chip wiring 109 as compared to the case where the side surface of the third semiconductor chip 106 is vertical to the main surface of the second semiconductor chip 104. As a result, the signal propagation distance between chips is further reduced and thus the signal propagation speed between chips is further improved.

According to the second embodiment, the first inter-chip wiring 108 and the second inter-chip wiring 109 are formed on the ground having a gentler slope. This reduces concentration of stresses on the bent portion of each wiring caused by heat or mechanical stresses. As a result, disconnection of the wirings can be prevented, thereby improving reliability of the semiconductor device. Moreover, there is no abrupt difference in level between the main surface of the first semiconductor chip 102 and the main surface of the second semiconductor chip 104 and between the main surface of the second semiconductor chip 104 and the main surface of the third semiconductor chip 106. This facilitates a lithography process for forming the first and second inter-chip wirings 108, 109, thereby increasing a process margin. Moreover, the insulating resin layer 107 for insulating the first inter-chip wirings 108 from the side surface of the second semiconductor chip 104 and insulating the second inter-chip wirings 108 from the side surface of the third semiconductor chip 106 has improved coverage.

Note that a semiconductor device having three chips stacked on each other is described in the second embodiment. However, a semiconductor device having two chips or four or more chips stacked on each other may alternatively be used as long as an upper semiconductor chip has a smaller area and each semiconductor chip has signal connection electrodes on the fringe region thereof. The same effects as those described above can be obtained by such a semiconductor device.

In the second embodiment, the stacked-chip element is mounted in a BGA-type semiconductor device by using a circuit board. However, the stacked-chip element may be mounted in a QFP or a QFN by using a lead frame. Alternatively, the stacked-chip element may be mounted in a TCP by a TAB technology. In such cases as well, a high-speed semiconductor device having a stacked-chip element mounted in a single package can be implemented.

In the second embodiment, $\theta 1$ (the angle of the side surface of the second semiconductor chip 104 with respect to the main surface of the first semiconductor chip 102) and $\theta 2$ (the angle of the side surface of the third semiconductor chip 106 with respect to the main surface of the second semiconductor chip 104) are preferably 80 degrees or less in view of the limitations on coverage of the insulating resin layer 107, sputtering coverage of the plating seed layer, or the like. As $\theta 1$ and $\theta 2$ are reduced to 60 degrees, 45 degrees and the like, the first inter-chip wirings 108 and the second inter-chip wirings 109 are formed with further improved reliability. Even if $\theta 1$ and $\theta 2$ are about 90 degrees, however, the same effects as those of the present embodiment can be obtained as long as the surface of the insulating resin layer 107 formed on the side surface of the second semiconductor chip 104 forms an angle of less than 90 degrees (more preferably, 80 degrees) with respect to the main surface of the first semiconductor chip 102 and the surface of the insulting resin layer 107 formed on the side surface of the third semiconductor chip 106 forms an angle of less than 90 degrees (more preferably, less than 80 degrees) with respect to the main surface of the second semiconductor chip 104. Moreover, in the step of cutting the second and third semiconductor wafers into second semiconductor chips 104 and third semiconductor chips 106 with a dicing blade, the ends of the second semiconductor chip 104 and the third semiconductor chip 106 can be relatively easily processed so that $\theta 1$ and $\theta 2$ become equal to about 60 degrees. However, it is difficult to reduce $\theta 1$ and $\theta 2$ to less than 30 degrees due to the limitations on the blade angle of the dicing blade. Moreover, as $\theta 1$ and $\theta 2$ are reduced, cracks, chippings or the like are more likely to be produced. In order to prevent such problems, secondary processing may be conducted after the ends of the second semiconductor chip 104 and the third semiconductor chip 106 are tapered in the forward direction. More specifically, an acute-angled edge in each chip end may be ground vertically or may be rounded off by a chemical etching method.

In the second embodiment, it is preferable that the total thickness of the second and third semiconductor chips 104, 106 is about 0.15 mm or less. In other words, it is preferable to grind the second semiconductor wafer 122 before dicing it into individual second semiconductor chips 104, and to grind the third semiconductor wafer (not shown) before dicing it into individual third semiconductor chips 106. More specifically, the second semiconductor wafer 122 is ground from the side opposite to the main surface of the second semiconductor chips 104, and the third semiconductor wafer is ground from the side opposite to the main surface of the third semiconductor chips 106 so that the total thickness of the second and third semiconductor chips 104, 106 becomes equal to about 0.15 mm or less. This reduces the difference in level between the respective main surfaces of the first and second semiconductor chips 102, 104 and also reduces the difference in level between the respective main surfaces of the second and third semiconductor chips 104, 106. This facilitates a lithography process for forming the first and second inter-chip wirings 108, 109, thereby increasing a process margin. However, it is difficult to form a resist pattern with an aspect ratio (i.e., the ratio of height to width) exceeding five. Therefore, each of the first and second inter-chip wirings 108, 109 must have a width of 0.02 mm or more. In other words, each of the first and second inter-chip wirings 108, 109 is a flat wiring with an aspect ratio of less than one. Accordingly, in a semiconductor device having two chips stacked on each other, it is preferable that the upper semiconductor chip has a thickness of about 0.15 mm or less. In a semiconductor device having four or more chips stacked on each other, it is preferable that the total thickness of the second semiconductor chip from the bottom and the semiconductor chips stacked thereon is about 0.15 mm or less.

Reducing the total thickness of the second and third semiconductor chips 104, 106 in the second embodiment would enable further reduction in size of a semiconductor device having multiple chips stacked on each other, and also enable further reduction in signal propagation distance between chips as well as further improvement in signal propagation speed between chips.

In the second embodiment, the second or third semiconductor wafer (i.e., the semiconductor wafer to be cut into the second or third semiconductor chips 104, 106) may be reduced in thickness by the following method: a semiconductor wafer having a thickness of about 0.50 mm to about 0.80 mm is first ground to about 0.15 mm to about 0.30 mm by a machining process. An example of the machining process is an infeed grinding method, a two-step grinding method using a grinding stone (rough machining step and finishing step). The resultant semiconductor wafer is further reduced in thickness to about 0.02 mm to about 0.08 mm by a chemical etching method, a CMP method, or the like. The reason why the chemical etching method or the CMP method is used is as follows: as the wafer thickness is reduced to 0.08 mm or less, it becomes difficult to grind the semiconductor wafer by a machining process in view of stresses, strength or the like.

In the second embodiment, the method for forming the first and second inter-chip wirings 108, 109 is not specifically limited. For example, the semi-additive method as used in the first embodiment may be used. Alternatively, another method such as a sputtering method may be used.

What is claimed is:

1. A method for manufacturing a semiconductor device including a first semiconductor chip having first electrodes on a fringe region of a main surface thereof, and a second semiconductor chip smaller in area than the first semiconductor chip and having second electrodes on a main surface thereof, comprising:
    a first step of preparing a first semiconductor wafer having a plurality of first semiconductor chips;
    a second step of preparing a second semiconductor wafer having a plurality of second semiconductor chips;
    a third step of cutting the second semiconductor wafer into the second semiconductor chips with a dicing blade while tapering ends of each second semiconductor chip in a forward direction;
    a fourth step of connecting the first semiconductor wafer and the second semiconductor chips together by bonding a surface of each second semiconductor chip that is opposite to the main surface thereof to a region of the main surface of a corresponding first semiconductor chip of the first semiconductor wafer other than the fringe region;
    a fifth step of forming a conductive film on the resultant first semiconductor wafer and patterning the conductive film to form wirings for connecting the first electrodes of each first semiconductor chip to the second electrodes of a corresponding second semiconductor chip; and
    a sixth step of cutting the resultant first semiconductor wafer into the first semiconductor chips as stacked-chip elements each having the first and second semiconductor chips stacked on each other.

2. The method according to claim 1, wherein the third step includes the step of processing the ends of each second semiconductor chip so that a side surface of the second semiconductor chip forms an angle of 30 degrees to less than 90 degrees with respect to a rear surface thereof.

3. The method according to claim 1, further comprising, between the second and third steps, the step of:
    grinding the second semiconductor wafer from a side opposite to the main surface of each second semiconductor chip so that each second semiconductor chip has a thickness of 0.15 mm or less.

4. The method according to claim 1, further comprising, between the fourth and fifth steps, the steps of:
    forming an insulating layer that covers the fringe region of the main surface of each first semiconductor chip, a side surface of each second semiconductor chip, and the main surface of each second semiconductor chip; and
    forming in the insulating layer first contact holes reaching the first electrodes of each first semiconductor chip and second contact holes reaching the second electrodes of each second semiconductor chip, wherein
    the fifth step includes the step of forming the conductive film on the insulating layer so as to fill the first contact holes and the second contact holes.

5. The method according to claim 1, wherein in the sixth step, the first semiconductor wafer is cut such that the side surface and the main surface of each first semiconductor chip form substantially a right angle.

6. The method according to claim 1, wherein the wirings are formed along a side surface of the second semiconductor chip.

* * * * *